United States Patent [19]

Takasaki et al.

[11] 4,406,053

[45] Sep. 27, 1983

[54] PROCESS FOR MANUFACTURING A SEMICONDUCTOR DEVICE HAVING A NON-POROUS PASSIVATION LAYER

[75] Inventors: Kanetake Takasaki, Tokyo; Yoshimi Shioya, Yokohama, both of Japan

[73] Assignee: Fujitsu Limited, Kawasaki, Japan

[21] Appl. No.: 289,296

[22] Filed: Jul. 31, 1981

[30] Foreign Application Priority Data

Jul. 31, 1980 [JP] Japan ................................. 55-105910

[51] Int. Cl.³ ............................................. H01L 21/56
[52] U.S. Cl. ........................................ 29/588; 357/52
[58] Field of Search ............... 148/1.5; 29/588, 576 T; 219/121 L, 121 LM; 357/52, 67

[56] References Cited

U.S. PATENT DOCUMENTS

| 3,725,309 | 4/1973 | Ames et al. | 29/590 X |
| 3,881,971 | 5/1975 | Greer et al. | 357/67 X |
| 4,059,461 | 11/1977 | Fan et al. | 148/1.5 |
| 4,229,232 | 10/1980 | Kirkpatrick | 148/1.5 |
| 4,284,659 | 9/1981 | Jaccodine et al. | 427/53.1 |
| 4,321,104 | 3/1982 | Hasegawa et al. | 357/67 X |

FOREIGN PATENT DOCUMENTS 2943153  5/1981  Fed. Rep. of Germany.

OTHER PUBLICATIONS

Auston, D. H. et al., "Lasers for Material Processing Applications", in *Bell Laboratories Record*, Jul./Aug. 1979, pp. 188-189.
Auston, D. H. et al., "New Role for the Laser", in *Bell Laboratories Record*, Jul./Aug. 1979, pp. 187-191.

*Primary Examiner*—L. Dewayne Rutledge
*Assistant Examiner*—Alan E. Schiavelli
*Attorney, Agent, or Firm*—Staas & Halsey

[57] ABSTRACT

A process for manufacturing a semiconductor device comprises the step of annealing a porous passivation layer which is deposited on the surface of the device and which covers metallization layers fabricated thereon, by irradiating a laser beam on the passivation layer so as to densify the passivation layer, while the laser beam scans the surface of the passivation layer.

9 Claims, 2 Drawing Figures

PROCESS FOR MANUFACTURING A SEMICONDUCTOR DEVICE HAVING A NON-POROUS PASSIVATION LAYER

FIELD OF THE INVENTION

The present invention relates to a process for producing a semiconductor device, particularly a process comprising a step of forming a passivation layer which is deposited on the surface of a device and which covers the metallization layers of the device.

THE PRIOR ART

A semiconductor device, such as an integrated circuit, usually has a passivation layer on the surface thereof so as to avoid undesirable penetration of moisture and/or cations, such as sodium ions, from the environment. Therefore, the passivation layer must not have even microsized pores.

The passivation layer is usually made of silicon nitride, silicon oxide or phosphorus silicate glass and is formed on the metallization layers which are composed mainly of aluminum. This metal has a tendency to deform at a temperature above 450° C. Therefore, the passivation layer must be deposited at a temperature lower than 450° C.

Furthermore, this demand is promoted by the needs for high integration density of a semiconductor device and, consequently, an accurate formation of semiconductor elements. The diffusion profile of impurities must not deteriorate during the processing of the passivation layer.

The passivation layer is usually formed by vapor phase deposition. Its deposition temperature varies depending on the type of the deposited composition, e.g., for silicon nitride about 850° C., for silicon oxide about 400° C. and for phosphorous silicate glass about 400°~450° C. In order to satisfy the above-mentioned low temperature deposition requirement, recently a silicon nitride passivation layer has been formed by plasma vapor phase deposition at about 300°~about 400° C. However, when a passivation layer is deposited on the surface of a semiconductor device at such a low temperature, the deposited layer cannot avoid being porous.

Furthermore, when a passivation layer of silicon nitride, silicon oxide or phosphorus silicate glass is formed, hydrogen atoms are liberated during the reaction and chemically combined with silicon etc., or mechanically occluded as gas in the pores of the passivation layer. The hydrogen deteriorates the semiconductor characteristics as reported recently by R. C. Sun et al. in "Effects of Silicon Nitride Encapsulation on MOS Device Stability" presented at the Semiconductor Interface Specialists Conference held in April, 1980.

In summarizing the above description, the passivation layer must not be heated to a temperature higher than 450° C. during both the depositing of the layer and the processing of it after its formation. In addition the thus formed passivation layer must not be porous, it must not occlude hydrogen gas in its pores, and it must not contain hydrogen atoms in a combined state with the atoms which constitute the material of the layer.

However, these requirements, for processing the passivation layer at a low temperature and for obtaining the passivation layer without pores and without containing hydrogen, contradict each other.

Apart from the passivation layer, instantaneous laser irradiation is used for annealing, wherein only the very surface of a material is heated up to a high temperature, and is rapidly cooled after the irradiation ceases. It is known that a semiconductor device is instantaneously irradiated by a laser beam after the process of ion implantation of its source and drain regions, so as to eliminate defects in the crystal. Such laser beam annealing has the advantage of maintaining the impurity profile of the formed source and drain regions with a controlled accuracy, whereas the impurity profile might deteriorate if the device was heated in a heating vessel for a long period.

However, it should be noted that a passivation layer is deposited after several processing steps so as to complete the fabrication of semiconductor elements and also metallization layers after the step of ion implantation.

SUMMARY OF THE INVENTION

It is an object of the present invention to produce a semiconductor device having a passivation layer which is not porous.

It is another object of the present invention to produce a semiconductor device having a passivation layer material which does not contain hydrogen.

It is still another object of the present invention to produce a semiconductor device having accurately formed metallization layers.

According to the present invention, there is provided a process for producing a semiconductor device comprising a step of annealing a porous passivation layer which is deposited on the surface of the device and which covers metallization layers fabricated thereon, by irradiating a laser beam on the passivation layer so as to densify the passivation layer, and scanning the surface of the passivation layer with the laser beam.

The laser beam may be a continuous beam or a pulsed beam. The laser beam can be generated by a YAG, ruby, argon or carbon dioxide laser. The passivation layer may be made from silicon nitride, silicon oxide, or phosphorous silicate glass. The metallization layers may be composed mainly of aluminum. The metallization layers may be composed of aluminum containing a small amount of silicon or copper.

Other objects and advantages of the present invention will further become apparent from the following description of the present invention.

DESCRIPTION OF THE PREFERRED EMBODIMENT

Figure 1:
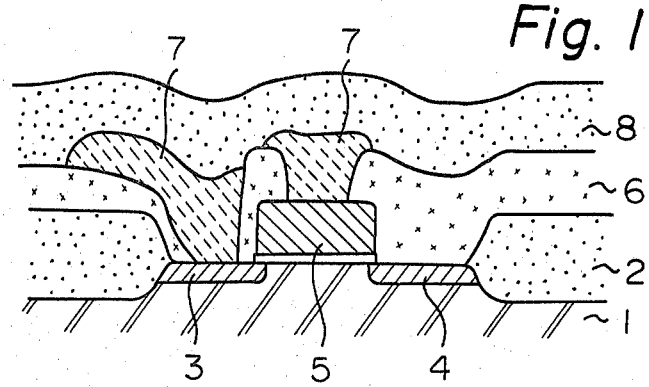
FIG. 1 is a sectional view of a MOS transistor in a semiconductor device.

Referring to FIG. 1, on a silicon substrate 1 there are formed a silicon oxide field layer 2 which isolates transistors from one another, ion-implanted source and drain regions 3 and 4, a polysilicon gate electrode 5, a phosphorus silicate glass layer 6, an aluminum metallization layer 7 and silicon nitride passivation layers 8. The silicon oxide field layer 2 has a dense structure, because it is oxidized at about 1000° C. for a relatively long period. In contrast, the silicon nitride passivation layers 8 are porous because they are formed by plasma vapor phase deposition at about 350° C. in order to avoid the deformation of the metallization layer 7.

A continuous argon laser beam of 5 W having wave lengths of 488 and 514 nm was generated. The argon laser beam, about 30~about 40 μm in diameter, was irradiated on the passivation layer with a scanning speed of 4 inch/sec. Thus, the surface of the passivation layer was instantaneously heated up to about 600° C. and was then rapidly cooled.

Figure 2:
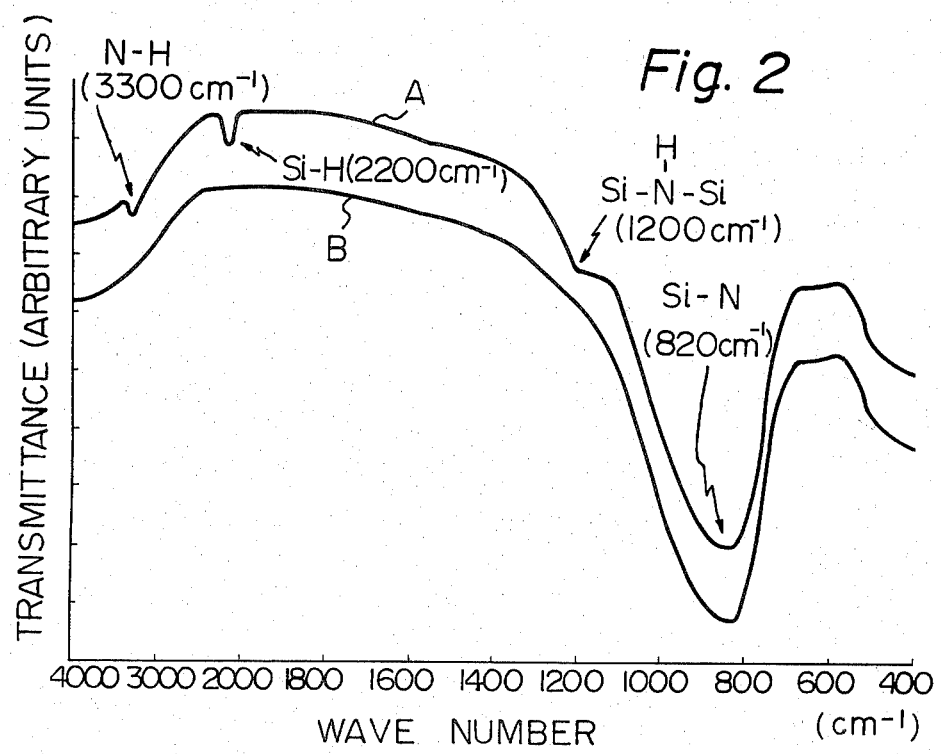
FIG. 2 shows the transmittance of infra-red spectra through a passivation layer on semiconductor devices of both the present invention and the prior art.

The infra-red absorption spectra of the silicon nitride passivation layer were measured both before and after the annealing step using laser beam scanning. FIG. 2 illustrates two absorption spectra, curve A exhibits the absorption characteristics of the passivation layer before the laser beam scanning, the curve B exhibits its behavior after the laser beam scanning. Absorption peaks are shown in these curves. A large peak of Si-N bond (820 cm$^{-1}$) is recognized in both curves. However, N-H bond (3300 cm$^{-1}$), Si-H bond (2200 cm$^{-1}$) and Si-N(-H)-Si (1200 cm$^{-1}$) disappear in the curve B of the annealed layer. The disappearance of these H-bonds reveals that hydrogen has been completely removed from the passivation layer.

In addition, the silicon nitride passivation layer was immersed in saturated hydrofluoric acid, before and after the laser beam scanning. The etching rate decreased from 1,100 Å/min to 300 Å/min. This reveals that the micro pores were substantially eliminated in the passivation layer.

Because the laser beam heats instantaneously only one point on the surface of the passivation layer, the underlying aluminum metallization layer does not fuse, and, therefore, its pattern does not deteriorate.

In the above-mentioned annealing process, a continuous argon laser beam was irradiated, however, it is evident that a continuous carbon oxide laser beam, as well as a pulsed YAG or ruby laser beam generated by a Q-switched laser, exhibits similar desired effects in producing a semiconductor device.

And it will be also clear to a person skilled in the art that such a laser beam scanning is effective for a passivation layer of silicon dioxide or phosphorous silicate glass formed by a method such as low temperature chemical vapour deposition or sputtering.

What is claimed is:

1. A process for manufacturing a semiconductor device having a non-porous passivation layer formed as an insulator on metallization layers by plasma chemical vapor deposition, comprising the step of annealing the passivation layer which is deposited on the surface of said semiconductor device and which covers the metallization layers fabricated thereon, by irradiating a laser beam on the passivation layer so as to densify the passivation layer, and scanning said laser beam across the surface of the passivation layer.

2. A process according to claim 1, wherein said irradiating step comprises generating a laser beam which is one of a continuous beam and a pulsed beam.

3. A process according to claim 2, wherein said irradiating step comprises generating the laser beam by using a YAG, ruby, argon or carbon dioxide laser.

4. A process according to claim 1, further comprising the step of forming the passivation layer from silicon nitride, silicon oxide or phosphorus silicate glass.

5. A process according to claim 1, further comprising the step of forming the metallization layers from aluminum.

6. A process according to claim 5, wherein said step of forming the metallization layers comprises forming the metallization layers from aluminum containing a small amount of silicon or copper.

7. A process for manufacturing a semiconductor device having a non-porous passivation layer formed on a metallization layer by plasma chemical vapor deposition, comprising the step of irradiating the passivation layer by scanning a laser beam across the surface of the passivation layer, so that the passivation layer is densified.

8. A process according to claim 7, wherein the scanning step comprises scanning the laser beam at the rate of four inches per second.

9. A process according to claim 8, wherein the irradiating step comprises instantaneously heating the scanned portion of the porous passivation layer to substantially 600° C.

* * * * *

UNITED STATES PATENT AND TRADEMARK OFFICE
CERTIFICATE OF CORRECTION

PATENT NO. : 4,406,053
DATED : September 27, 1983
INVENTOR(S) : Takasaki et al.

It is certified that error appears in the above-identified patent and that said Letters Patent is hereby corrected as shown below:

Column 1, line 60, after "addition" insert --,--.

Column 3, line 20, "(3300 $cm^{-1}$), Si-H bond (2200 $cm^{-1}$) should be --(3300 $cm^{-1}$), Si-H bond (2200 $cm^{-1}$)

Column 4, line 2, "vapour" should be --vapor--.

*Signed and Sealed this*

*Tenth* Day of *April 1984*

[SEAL]

*Attest:*

GERALD J. MOSSINGHOFF

*Attesting Officer* *Commissioner of Patents and Trademarks*